(12) United States Patent
Yao et al.

(10) Patent No.: US 7,470,500 B2
(45) Date of Patent: Dec. 30, 2008

(54) ORGANIC BOTTOM ANTIREFLECTIVE POLYMER COMPOSITIONS

(75) Inventors: Huirong Yao, Plainsboro, NJ (US); Shuji S. Ding-Lee, Branchburg, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 302 days.

(21) Appl. No.: 11/184,593

(22) Filed: Jul. 19, 2005

(65) Prior Publication Data

US 2007/0020557 A1     Jan. 25, 2007

(51) Int. Cl.
*G03F 7/00* (2006.01)
*G03F 7/004* (2006.01)

(52) U.S. Cl. ...................... 430/270.1; 528/36

(58) Field of Classification Search .............. 430/270.1, 430/273.1; 528/63
See application file for complete search history.

(56) References Cited

U.S. PATENT DOCUMENTS

| | | | |
|---|---|---|---|
| 2,901,467 A | | 8/1959 | Croco |
| 4,536,468 A | * | 8/1985 | Yasui et al. ................ 430/296 |
| 4,581,321 A | | 4/1986 | Stahlhofen |
| 4,889,789 A | | 12/1989 | Stahlhofen |
| 6,100,308 A | * | 8/2000 | Guettes et al. .............. 521/131 |
| 6,133,399 A | * | 10/2000 | Smith et al. .................... 528/73 |
| 6,852,421 B2 | * | 2/2005 | Wayton et al. ............. 428/480 |
| 7,084,207 B2 | * | 8/2006 | Yamana et al. ............... 525/60 |
| 7,144,969 B2 | * | 12/2006 | McDonald ................... 528/63 |
| 7,217,491 B2 | * | 5/2007 | McGinniss et al. ....... 430/270.1 |
| 2004/0023156 A1 | | 2/2004 | McGinness et al. |

FOREIGN PATENT DOCUMENTS

| | | |
|---|---|---|
| CA | 1 204 547 A | 5/1986 |
| DE | 36 34 371 A1 | 4/1988 |
| EP | 0 676 428 A1 | 10/1995 |
| GB | 1221798 | 2/1971 |
| JP | 1-293339 A | 11/1989 |
| WO | WO 02/24777 A2 | 3/2002 |

OTHER PUBLICATIONS

Tsai et al., "Physical Properties of Crosslinked Polyurethanes", Polymer International 47 (1998) pp. 445-450.*
Notification of Transmittal of the International Search Report and the Written Opinion of the International Searching Authority, or the Declaration (Form PCT/ISA/220); International Search Report (Form PCT/ISA/210); and Written Opinion of the International Searching Authority (Form PCT/ISA/237) for PCT/IB2006/002041.
English Language Abstract of JP 1-293339 A.
English language abstract of EP 0 263 434 (corresponding to DE 36 34 371 A1).
Notification Concerning Transmittal of Copy of International Preliminary Report on Patentability (Chapter I of the Patent Cooperation Treaty) (Form PCT/IB/326), the International Preliminary Report on Patentability (Form PCT/ISA/373), and the Written Opinion of the International Searching Authority (Form PCT/ISA/237) for PCT/IB2006/002041.

* cited by examiner

*Primary Examiner*—Amanda C. Walke
(74) *Attorney, Agent, or Firm*—Alan P. Kass

(57) ABSTRACT

The present invention relates to bottom antireflective coating compositions, polymers useful in making such compositions, and their use in image processing by forming a thin layer between a reflective substrate and a photoresist coating.

15 Claims, No Drawings

ORGANIC BOTTOM ANTIREFLECTIVE POLYMER COMPOSITIONS

BACKGROUND OF THE INVENTION

The present invention relates to bottom antireflective coating compositions, polymers useful in making such compositions, and their use in image processing by forming a thin layer between a reflective substrate and a photoresist coating. Such compositions are especially useful in the fabrication of semiconductor devices by photolithographic techniques and provide improved etch-rate for such bottom antireflective coatings.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has lead to the use of sophisticated multilevel systems to overcome difficulties associated with such miniaturization. The use of highly absorbing anti-reflective coatings in photolithography is a simpler approach to diminish the problems that result from back reflection of light from highly reflective substrates. Two deleterious effects of back reflectivity are thin film interference and reflective notching. Thin film interference results in changes in critical linewidth dimensions caused by variations in the total light intensity in the resist film as the thickness of the resist changes. Variations of linewidth are proportional to the swing ratio (S) and therefore must be minimized for better linewidth control. Swing ratio is defined as $$S = 4(R_a R_b)^{1/2} e^{-\alpha D}$$

where $R_a$ is the reflectivity at the resist/air or resist/top coat interface,
where $R_b$ is the reflectivity at the resist/substrate interface,
where $\alpha$ is the resist optical absorption coefficient, and
D is the film thickness.

Bottom anti-reflective coatings function by absorbing the radiation used for exposing the photoresist, thus reducing $R_b$ and thereby reducing the swing ratio. Reflective notching becomes severe as the photoresist is patterned over substrates containing topographical features, which scatter light through the photoresist film, leading to linewidth variations, and in the extreme case, forming regions with complete resist loss. Similarly, dyed top anti-reflective coatings reduce the swing ratio by reducing $R_a$, where the coating has the optimal values for refractive index and absorption characteristics, such as absorbing wavelength and intensity.

SUMMARY OF THE INVENTION

The present invention relates to a polymer comprising recurring monomers of $$O=C=N-R_1-N=C=O \quad \text{(a)}$$

and $$R_2(OH)_j \quad \text{(b)}$$

and, optionally, (c) a compound selected from $$H(OR_4)_n OH \quad \text{(c1)}$$

and $$R_3(OH)_2 \quad \text{(c2)}$$

where each of $R_1$, $R_2$, and $R_3$ are independently an unsubstituted or substituted aliphatic, aromatic, alicyclic, or heterocyclic polyvalent group; $R_4$ is selected from $-CH_2CH_2-$, $-CH_2CH(CH_3)-$, and $-CH_2CH_2CH_2CH_2-$; j is an integer from 3 to 6 inclusive; n is integer from 1 to 30 inclusive; and the ratio of equivalents of (a):(b)+(c) is 1:1 and the ratio of equivalents of (c):(b), when (c) is present, ranges from about 1:4 to about 4:1.

The invention also relates to an antireflective coating composition comprising the polymer of the present invention and at least one crosslinking agent.

The invention also relates to a process for forming an image on a substrate comprising a) coating the substrate with the composition of present invention; b) heating the coating of step a); c) forming a coating from a photoresist solution on the coating of step b); d) heating the photoresist coating to substantially remove solvent from the coating; e) image-wise exposing the photoresist coating; f) developing an image using an aqueous alkaline developer; g) optionally, heating the substrate prior to and after development; and h) dry etching the composition of step b).

DETAILED DESCRIPTION OF THE INVENTION

The present invention relates to a polymer comprising recurring monomers of $$O=C=N-R_1-N=C=O \quad \text{(a)}$$

and $$R_2(OH)_j \quad \text{(b)}$$

and, optionally, (c) a compound selected from $$H(OR_4)_n OH \quad \text{(c1)}$$

and $$R_3(OH)_2 \quad \text{(c2)}$$

where each of $R_1$, $R_2$, and $R_3$ are independently an unsubstituted or substituted aliphatic, aromatic, alicyclic, or heterocyclic polyvalent group; $R_4$ is selected from $-CH_2CH_2-$, $-CH_2CH(CH_3)-$, and $-CH_2CH_2CH_2CH_2-$; j is an integer from 3 to 6 inclusive; n is integer from 1 to 30 inclusive; and the ratio of equivalents of (a):(b)+(c) is 1:1 and the ratio of equivalents of (c):(b), when (c) is present, ranges from about 1:4 to about 4:1.

The invention also relates to an antireflective coating composition comprising the polymer of the present invention and at least one crosslinking agent.

The invention also relates to a process for forming an image on a substrate comprising a) coating the substrate with the composition of present invention; b) heating the coating of step a); c) forming a coating from a photoresist solution on the coating of step b); d) heating the photoresist coating to substantially remove solvent from the coating; e) image-wise exposing the photoresist coating; f) developing an image using an aqueous alkaline developer; g) optionally, heating the substrate prior to and after development; and h) dry etching the composition of step b).

The compound (a) useful in the practice of the present invention may be represented by the following formula $$O=C=N-R_1-N=C=O$$

where $R_1$ is an unsubstituted or substituted aliphatic, aromatic, alicyclic, or heterocyclic polyvalent group. The aliphatic group can be linear or branched. The aromatic group, alicyclic group, and heterocyclic group can each have two or more rings, aromatic, alicyclic, and/or heterocyclic, which are condensed or bonded to each other through a direct bond or through a bridge or linking group. Examples of substituents include, but are not limited to, ether groups, ester groups, aryl groups, aliphatic groups, cycloaliphatic groups, or halogen atoms.

Examples of compound (a) include aliphatic diisocyanate compound such as hexamethylene diisocyanate, 1,2-ethylene diisocyanate, trimethylenediisocyanate, 1,4-tetramethylene-diisocyanate, pentamethylenediisocyanate, 1,6-hexamethylene diisocyanate, 1,2-propylenediisocyanate, 1,2-butylenediisocyanate, trimethylhexamethylene diisocyanate, 2,2,4- and 2,4,4-trimethyl-1,6-hexamethylene diisocyanate, 1,12-dodecane diisocyanate, dimer acid diisocyanate, lysine diisocyanate, 2,3-butylenediisocyanate, 1,3-butylene-diisocyanate and the like; alicyclic diisocyanate compound such as isophorone diisocyanate, 4,4'-methylene bis(cyclohexylisocyanate), 1,3-cyclobutane diisocyanate, 1,3-(isocyanatomethyl)cyclohexane, 2,2- 2,4-, and 2,6-diisocynanato-1 -methylcyclohexane, 2,4'- and 4,4'-dicylohexyl diisocyanate, methylcyclohexane-2,4-(or -2,6-) diisocyanate, 1,3-(or 1,4-)-di(isocyanatomethyl)cyclohexane, 1,3- and 1,4-cyclohexanediisocyanate, 1,3-cyclopentanediisocyanate, 1 -isocyanate-3,3,5-trimethyl-5-isocyanate methylcyclohexane, cyclohexane-1,3-bis(methylisocyanate), cyclohexane-1,4-bis(methylisocyanate), 1,2-cyclohexanediisocyanate and the like; aromatic diisocyanate compound such as 1-methoxyphenylene-2,4-diisocyanate, 1-methylphenylene-2,4-diisocyanate, 2,4-tolylene diisocyanate, 2,6-tolylene diisocyanate, 4,4'-toluidinediisocyanate, (m- or p-) phenylene diisocyanate, xylylene diisocyanate, methaxylylene diisocyanate, (m- or p-) tetramethylxlylene diisocyanate, 4,4'-diphenyl-methanediisocyaniate, 1,3- and 1,4-phenylene diisocyanate, 4,4'-diisocyanato-3,3'-dimethoxybiphenyl, 4,4'-diisocyanato-3,3'-dimethylbiphenyl, 4,4'-diisocyanato-3,3'-diphenylbiphenyl, 2,4'- and 4,4'-diisocyanato diphenylmethane, 4,4'-diisocyanatobiphenyl, 1,5-naphthalenediisocyanate, 2,7-naphthalenediisocyanate, 1,4-naphthalenediisocyanate, anthraquinone-2,6-diisocyanate, 4,4'-diphenyletherdiisocyanate, (m- or p-) phenylenediisocyanate, 4,4'-biphenylenediisocyanate, 3,3'-dimethyl-4,4'-biphenylenediisocyanate, bis(4-isocyanatophenyl) sulfone, isopropylidene bis(4-phenylisocyanate) and the like; heterocyclic diisocyanate, for example, 3,9-bis(3-isocyanatopropyl)-2,4,8,10-tetraspiro[5,5]undecane, furfurylidene diisocyanate and so on; adducts prepared by reacting a polyol such as ethylene glycol, propylene glycol, 1,4-butylene glycol, polyalkylene glycol, trimethylolpropane, hexanetriol and the like with a polyisocyanate compound in an excess amount of isocyanate group relative to hydroxy group in the polyol, biuret type adducts of hexamethyllenediisocyanate, isophoronediisocyanate, tolylenediisocyanate, xylylenediisocyanate, 4,4'-diphenylmethanediisocyanate, 4,4'-methylene bis(cyclohexylisocyanate) and the like, isocyanuric ring type adducts, and the like, 4,4'-dicyclohexylmethane, triphenylenemethane, tetramethylxylene and the like, and prepolymers having an isocyanate group at both terminals obtained from a reaction between a stoichiometrically excessive amount of one of the above organic diisocyanates and a bifunctional active hydrogen-containing compound.

The compound (b) useful in the practice of the present invention may be represented by the following formula $$R_2(OH)_j$$

where $R_2$ is an unsubstituted or substituted aliphatic, aromatic, alicyclic, or heterocyclic polyvalent group; and j is an integer from 3 to 6 inclusive. The aliphatic group can be linear or branched. The aromatic group, alicyclic group, and heterocyclic group can each have two or more rings, aromatic, alicyclic, and/or heterocyclic, which are condensed or bonded to each other through a direct bond or through a bridge or linking group. Examples of substituents include, but are not limited to, ether groups, ester groups, aryl groups, aliphatic groups, cycloaliphatic groups, or halogen atoms.

Examples of compound (b) include, but are not limited to, triols and tetraols, as well as other polyols.

Examples of aliphatic, which may be linear or branched, and alicyclic triols include e.g. glycerol, 1,1,1-tris(hydroxymethyl)ethane, trimethylolpropane, 2-hydroxymethyl-1,3-propanediol, 2-ethyl-2-(hydroxymethyl)-1,3-propanediol, 2-hydroxymethy-2-propyl-1,3-propanediol, 2-hydroxymethy-1,4-butanediol, 2-hydroxyethyl-2-methyl-1,4-butanediol, 2-hydroxymethyl-2-propyl- 1 ,4-butanediol, 2-ethyl-2-hydroxyethyl-1,4-butanediol, 1,2,3-butanetriol, 1,2,4-butanetriol, 3-(hydroxymethyl)-3-methyl-1,4-pentanediol, 1,2,5-pentanetriol, 1,3,5-pentanetriol, 1,2,3-trihydroxhexane, 1,2,6-trihydroxyhexane, 2,5-dimethyl-1,2,6-hexanetriol, tris(hydroxymethyl )nitromethane, 2-methyl-2-nitro-1,3-propanediol, 2-bromo-2-nitro-1,3-propanediol, 1,2,4-cyclopentanetriol, 1,2,3-cylcopentanetriol, 1,3,5-cyclohexanetriol, 1,3,5-cyclohexanetrimethanol, 1,3,5-tris(2-hydroxyethyl)cyanuric acid, and the like.

Examples of tetraols include e.g. 1,2,3,4-butanetetrol, 2,2-bis(hydroxymethyl)-1,3-propanediol, 1,2,4,5-pentanetetrol, tetrahydroxy-1,4-benzoquionone, α-methylmannopyranoside, 2-deoxygalactose, 3-O-methylglucose, ribose, erythritol, pentaerythritol, xylose, and the like.

The compound (c), which may be optionally present, in the practice of the present invention may be selected from $$H(OR_4)_nOH \quad (c1)$$

and $$R_3(OH)_2 \quad (c2)$$

where n is integer from 1 to 30 inclusive; $R_3$ is an unsubstituted or substituted aliphatic, aromatic, alicyclic, or heterocyclic polyvalent group; and $R_4$ is selected from $-CH_2CH_2-$, $-CH_2CH(CH_3)-$, and $-CH_2CH_2CH_2CH_2-$. The aliphatic group can be linear or branched. The aromatic group, alicyclic group, and heterocyclic group can each have two or more rings, aromatic, alicyclic, and/or heterocyclic, which are condensed or bonded to each other through a direct bond or through a bridge or linking group. Examples of substituents include, but are not limited to, ether groups, ester groups, aryl groups, aliphatic groups, cycloaliphatic groups, or halogen atoms.

Examples of compound (c), which is selected from (c1) and (c2) include, but are not limited to, for example, ethylene glycol, 1,3-propanediol, 1,2-propanediol, 2,2-dimethyl-1,3- propanediol, 2,2-diethyl-1,3-propanediol, 2-ethyl-3-methyl-1,3-propanediol, 2-methyl-2-propyl-1,3-propanediol, 2-butyl-2-ethyl-1,3-propanediol, 1,4-butanediol, 2-methyl-1,4-butanediol, 1,2-butanediol, 1,3-butanediol, 2,3-butanediol, 2,3-dimethyl-2,3-butanediol, 1,5-pentanediol, 1,2-pentanediol, 2,4-pentanediol, 2-methyl-2,4-pentanediol, 1,6-hexandiol, 2,5-hexanediol, 1,2-hexanediol, 1,5-hexanediol, 2-ethyl-1,3-hexanediol, 2,5-dimethyl-2,5-hexanediol, 1,7-heptanediol, 1,8-octanediol, 1,2-octanediol, 1,9-nonanediol, 1,10-decanediol, 1,2-decanediol, 1,12-dodecanediol, 1,2-dodedanediol, 1,2-tetradecanediol, 1,2-hexadecanediol, 1,16-hexadecanediol, polyethylene glycol having a molecular weight of from 200 to 1500, 1,2-cyclobutanedimethanol, 1,4-cyclohexanedimethanol, 1,2-cyclohexanedimethanol, 5-norbonene-2,2-dimethanol, 3-cyclohexene-1,1-dimethanol, dicyclohexyl-4,4'-diol, 1,2-cyclopentanediol, 1,3-cyclopentanediol, 1,2-cyclooctanediol, 1,4-cyclooctanediol, 1,5-cylcooctanediol, 1,2-cyclohexanediol, 1,3-cyclohexanediol, 1,4-cyclohexanediol, 1,2-cycloheptanediol, 2,2,4,4-tetramethyl-1,3-cyclobutanediol, 1,2-cyclododecanediol, decahydronaphthalene1,4-diol, decahydronaphthalene-1,5-diol, 3-chloro-1,2-propanediol, 1,4-dibromobutane-2,3-diol, 2,2,3,3-tetrafluoro,4-butanediol, diethylene glycol, triethylene glycol, tetraethylene glycol, pentaethylene glycol, dipropylene glycol, isosorbide, isomannide, 1,3-dioxane-5,5-dimethanol, 1,4-dioxane-2,3-diol, 1,4-dithiane-2,5-diol, 1,2-dithiane-4,5-diol, 2-hydroxyethyldisulfide, 3,6-dithia-1,8-octanediol, 3,3'-thiodipropanol, 2,2'-thiodiethanol, 1,3-hydroxyacetone, 1,5-dihydroxy-2,2,4,4-tetrachloro-3-pentanone, glyceraldehydes, benzopinacole, 1,1,4,4-tetraphenyl-1,4-butanediol, 3,4-bis(p-hydroxyphenol)-3,4-hexanediol, 1,2-benzenedimethanol, 1,4-benaenedimethanol, 2,3,5,6-tetramethyl-p-xylene-α,α'-diol, 2,4,5,6-tetrachlorobenzene-1,3-dimethanol, 2,3,5,6-tetrachlorobenzene-1,4-dimethanol, 2,2-diphenyl-1,3-propanediol, 3-(4-chlorophenoxy)-1,2-propanediol, 2,2'-(p-phenylenedioxy)-diethanol, 1,8-bis(hydroxymethyl) naphthalene, 2,6-bis(hydroxymethyl)-p-cresol, 1,4-bis(2-hydroxyethyl)benzene, 5,6-isopropylideneascorbic acid, and the like.

The ratio of equivalents of (a):(b)+(c) is preferably 1:1. The ratio of equivalents of (c):(b), when (c) is present, ranges from about 1:4 to about 4:1, preferably from about 1:3 to about 3:1, more preferably from about 1:2 to about 2:1, and even more preferably from about 1:1 to about 2:1. The polymer contains at least 25 weight % of (a).

Crosslinking agents are those agents which are capable of forming a crosslinked structure under the action of an acid. Some examples of crosslinking agents include aminoplasts such as, for example, glycoluril-formaldehyde resins, melamine-formaldehyde resins, benzoguanamine-formaldehyde resins, and urea-formaldehyde resins. The use of methylated and/or butylated forms of these resins is highly preferred for obtaining long storage life (3-12 months) in catalyzed form. Highly methylated melamine-formaldehyde resins having degrees of polymerization less than two are useful. Monomeric, methylated glycoluril-formaldehyde resins are useful for preparing thermosetting polyester anti-reflective coatings which can be used in conjunction with acid-sensitive photoresists. One example is N,N,N,N-tetra(alkoxymethyl) glycoluril. Examples of N,N,N,N-tetra(alkoxymethyl)glycoluril, may include, e.g., N,N,N,N-tetra(methoxymethyl) glycoluril, N,N ,N,N-tetra(ethoxymethyl)glycoluril, N,N,N,N-tetra(n-propoxymethyl)glycoluril, N,N,N,N-tetra(i-propoxymethyl)glycoluril, N,N,N,N-tetra(n-butoxymethyl)glycoluril and N,N,N,N-tetra(t-butoxymethyl)glycoluril. N,N,N,N-tetra(methoxymethyl)glycoluril is available under the trademark POWDERLINK from Cytec Industries (e.g., POWDERLINK 1174). Other examples include methylpropyltetramethoxymethyl glycoluril, and methylphenyltetramethoxymethyl glycoluril. Similar materials are also available under the NIKALAC tradename from Sanwa Chemical (Japan).

Other aminoplast crosslinking agents are commercially available from Cytec Industries under the trademark CYMEL and from Monsanto Chemical Co. under the trademark RESIMENE. Condensation products of other amines and amides can also be employed, for example, aldehyde condensates of triazines, diazines, diazoles, guanidines, guanimines and alkyl- and aryl-substituted derivatives of such compounds, including alkyl- and aryl-substituted melamines. Some examples of such compounds are N,N'-dimethyl urea, benzourea, dicyandiamide, formaguanamine, acetoguanamine, ammeline, 2-chloro-4,6-diamino-1,3,5-triazine, 6-methyl-2,4-diamino,1,3,5-triazine, 3,5-diaminotriazole, triaminopyrimidine,2-mercapto4,6-diamino-pyrimidine, 3,4,6-tris(ethylamino)-1,3,5-triazine, tris(alkoxycarbonylamino)triazine, N,N,N',N'-tetramethoxymethylurea, methylolbenzoguanamine or alkyl ether compound thereof, such as tetramethylolbenzoguanamine, tetramethoxymethylbenzoguanamine and trimethoxymethylbenzoguanamine; 2,6-bis(hydroxymethyl)4-methylphenol or alkyl ether compound thereof; 4-tert-butyl-2,6-bis(hydroxymethyl)phenol or alkyl ether compound thereof; 5-ethyl-1,3-bis(hydroxymethyl)perhydro-1,3,5-triazin-2-one (common name: N-ethyldimethylol-triazine) or alkyl ether compound thereof; N,N-dimethylolt-rimethyleneurea or dialkyl ether compound thereof; 3,5-bis (hydroxymethyl)perhydro-1 ,3,5-oxadiazin-4-one (common name: dimethylolurone) or alkyl ether compound thereof; and tetramethylolglyoxazaldiurein or dialkyl ether compound thereof and the like.

Other possible crosslinking agents include: 2,6-bis(hydroxymethyl)-p-cresol and compounds having the following structures:

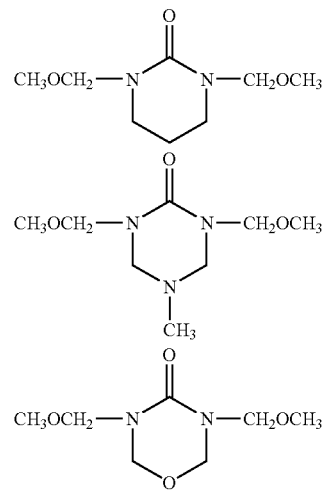

including their analogs and derivatives, such as those found in Japanese Laid-Open Patent Application (Kokai) No. 1-293339 to Tosoh, methylolmelamines, such as hexamethylolmelamine, pentamethylolmelamine, and tetramethylolmelamine as well as etherified amino resins, for example alkoxylated melamine resins (for example, hexamethoxymethylmelamine, pentamethoxymethylmelamine, hexaethoxymethylmelamine, hexabutoxymethylmelamine and tetramethoxymethylmelamine) or methylated/butylated glycolurils, for example as well as those found in Canadian Patent No. 1 204 547 to Ciba Specialty Chemicals. Other examples include, for example, N,N,N,N-tetrahydroxymethylglycoluril, 2,6-dihydroxymethylphenol, 2,2',6,6'-tetrahydroxymethyl-bisphenol A, 1,4-bis[2-(2-hydroxypropyl)]benzene, and the like, etc. Other examples of crosslinking agents include those described in U.S. Pat. Nos. 4,581,321, 4,889, 789, and DE-A 36 34 371, the contents of which are incorporated by reference. Various melamine and urea resins are commercially available under the Nikalacs (Sanwa Chemical Co.), Plastopal (BASF AG), or Maprenal (Clariant GmbH) tradenames.

The.crosslinking agent can be used individually or in mixtures with each other. The crosslinking agent is added to the composition in a proportion which provides from about 0.10 to about 2.00 equivalents of crosslinking function per reactive group on the polymer.

The antireflective coating composition can further comprise one or more components selected from cross-linking catalysts, solvents, monomeric dyes, surface leveling agents, adhesion promoters, and antifoaming agents.

Cross-linking catalysts include, for example, acid generators, acids, and mixtures thereof. One example of an acid generator is a thermal acid generator. A thermal acid generator is a compound which is not an acid but which is converted to an acid upon heating of the photoresist film. Suitable thermal acid generators useful in the present invention include the ammonium salts of acids where the corresponding amine is volatile. Ammonium salts of acids are prepared by neutralizing an acid with ammonia or an amine. The amine may be a primary, secondary or tertiary amine. The amine must be volatile since it must evaporate from the anti-reflective film upon heating to the temperature required to crosslink the film. When the amine or ammonia evaporates from the anti-reflective film upon heating it leaves an acid in the film. This acid is then present in the anti-reflective film and is employed to catalyze the acid hardening crosslinking reaction upon heating, unless it becomes neutralized by a corresponding amount of a base. Photoacid generators may also be present in the composition and their use and types are well known in the art.

Examples of acid generators include onium salts, benzoin tosylate, nitrobenzyl tosylates, such as 2-nitrobenzyl tosylate, 2,4-dinitrobenzyl tosylate, 2,6-dinitrobenzyl tosylate, 4-nitrobenzyl tosylate; nitrobenzyl benzenesulfonates such as 2-trifluoromethyl-6-nitrobenzyl 4-chlorobenzenesulfonate, as 2-trifluoromethyl-6-nitrobenzyl 4-nitro benzenesulfonate; phenolic sulfonate esters such as phenyl-4-methoxybenzenesulfonate, tris(2,3-dibromopropyl)-1,3,5-triazine-2,4,6-trione, 2,4,4,6-tetrabromocyclohexadienone, the alkyl esters of organic sulfonic acids, p-toluenesulfonic acid, dodecylbenzenesulfonic acid, oxalic acid, phthalic acid, phosphoric acid, camphorsulfonic acid, alkyl and aryl sulfonic acid esters, aromatic sulfonamides, alkyl and aryl phosphoric acid esters, their salts, and mixtures thereof. When benzoin tosylate is heated toluene sulfonic acid is produced by a substitution reaction. Alkyl sulfonates which produce the sulfonic acid by elimination upon heating are examples of other thermal acid generators.

Examples of acids which can be used include the non-salts of the above acid generators and include, for example, organic acids such as sulfonic acids (for example, alkyl and aryl sulfonic acids such as phenylsulfonic acid and para-toluenesulfonic acid), and alkyl and aryl phosphoric acids. One or more cross-linking catalysts can be used in the composition.

Examples of solvents for the coating composition include alcohols, esters, glymes, ethers, glycol ethers, glycol ether esters, ketones, cyclic ketones, and mixtures thereof. Examples of such solvents include, but are not limited to, propylene glycol methyl ether, propylene glycol methyl ether acetate, cyclohexanone, 2-heptanone, ethyl 3-ethoxy-propionate, propylene glycol methyl ether acetate, ethyl lactate, and methyl 3-methoxypropionate. The solvent is typically present in an amount of from about 40 to about 95 weight percent.

Since the composition is coated on top of the substrate and is further subjected to dry etching, it is envisioned that the composition is of sufficiently low metal ion level and purity that the properties of the semiconductor device are not adversely affected. Treatments such as passing a solution of the polymer, or compositions containing such polymers, through an ion exchange column, filtration, and extraction processes can be used to reduce the concentration of metal ions and to reduce particles.

The coating composition can be coated on the substrate using techniques well known to those skilled in the art, such as dipping, spin coating or spraying. The film thickness of the anti-reflective coating ranges from about 0.01 µm to about 1 µm. The coating can be heated on a hot plate or convection oven or other well known heating methods to remove any residual solvent and induce crosslinking if desired, and insolubilizing the anti-reflective coatings to prevent intermixing between the anti-reflective coating and the photoresist.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Negative working photoresist and positive working photoresist compositions and their use are well known to those skilled in the art.

A process of the instant invention comprises coating a substrate with a coating composition comprising a polymer of the present invention and heating the substrate on a hotplate or convection oven or other well known heating methods at a sufficient temperature for sufficient length of time to remove the coating solvent, and crosslink the polymer if necessary, to a sufficient extent so that the coating is not soluble in the coating solution of a photoresist or in a aqueous alkaline developer. An edge bead remover may be applied to clean the edges of the substrate using processes well known in the art. The heating ranges in temperature from about 70° C. to about 250° C. If the temperature is below 70° C. then insufficient loss of solvent or insufficient amount of crosslinking may take place, and at temperatures above 250° C., the polymer may become chemically unstable. A film of a photoresist composition is then coated on top of the anti-reflective coating and baked to substantially remove the photoresist solvent. The photoresist is image-wise exposed and developed in an aqueous developer to remove the treated resist. An optional heating step can be incorporated into the process prior to development and after exposure. The process of coating and imaging photoresists is well known to those skilled in the art and is optimized for the specific type of resist used. The patterned substrate can then be dry etched in a suitable etch chamber to remove the exposed portions of the anti-reflective film, with the remaining photoresist acting as an etch mask.

EXAMPLES

Example 1

Synthesis of Polyurethane MDI/PEG/Glycerol Copolymer 25 grams of polyethylene glycol (Mn~1000) and 5 grams of glycerol were each dried separately at 100° C. under vacuum for 1 hour prior to use. 9.0 grams (36 mmol) of methylene bis(4-phenylisocyanate) (MDI) was added to a 250 ml round bottom flask and the flask was purged with dry nitrogen while heating the flask to 80° C. to melt the MDI. 20 grams of the dried polyethylene glycol (Mn~1000) was cooled down to 60° C. and added to the above melted MDI in the flask. The reaction was allowed to proceed for 2 hours at 100° C. under reduced pressure and thereafter cooled down to 60° C. 1.84 grams (20 mmol) of the dried glycerol was added to the flask at 80° C. and the reaction was then continued for 1 hour at 100° C. 50 grams of hot propylene glycol monomethyl ether acetate was then added to the flask under nitrogen and the solution was stirred at 100° C. for 1 hour. The solution was then allowed to cool down. The solution was then precipitated in ether, causing the polymer to precipitate out. The precipitate was collected and then re-precipitated in water. The resulting polymer was then collected and dried. The polymer was dissolved in ethyl lactate to form a 9.2% solution.

Example 2

Synthesis of Polyurethane MDI/PEG/THCA Copolymer 15 grams of polyethylene glycol (Mn~1000) was dried at 100° C. under vacuum for 1 hour before use. 10 grams of methylene bis(4-phenylisocyanate) (MDI) was added to a 250 ml round bottom flask and the flask was purged with dry nitrogen while heating the flask to 80° C. to melt the MDI. 10 grams of the dried polyethylene glycol (Mn ~1000) was cooled down to 60° C. and added to the above melted MDI in the flask. The reaction was allowed to proceed for 2 hours at 100° C. under reduced pressure and thereafter cooled down to 60° C. A three-neck round bottom flask was prepared with a stirrer and nitrogen and addition funnel inlets. 8.62 grams (33 mmol) of 1,3,5-trishydroxyethyl cyanuric acid (THCA) was added to 50 ml of cyclohexanone under nitrogen and the mixture was heated to 80° C. 20 grams of the MDI/polyethylene glycol material from the flask was transferred to the addition funnel and the MDI/polyethylene glycol material was added to the THCA mixture over a period of 30 minutes at 80° C. The reaction was allowed to continue for another 30 minutes and then the resulting mixture was allowed to cool down. After cooling down, the product mixture was diluted with THF and then precipitated in water, causing the polymer to precipitate out. The precipitate was collected and then re-precipitated in water and the precipitated polymer was removed and allowed to dry. Sufficient polymer was dissolved in ethyl lactate to form a 9.0% solution.

Example 3

Synthesis of MDI/THCA Polymer 11.5 grams (44 mmol) of 1,3,5-trishydroxyethyl cyanuric acid was dissolved in flask containing 60 grams of cyclohexanone under nitrogen at 100° C. for 1 hour and then cooled down to 80° C. 10.2 grams (41 mmol) of methylene bis(4-phenylisocyanate) (MDI) was added in three equal portions to the flask over a time period of 30 minutes. The solution was stirred for an additional 30 minutes at 80° C. once all the MDI was added to the flask. The contents were then allowed to cool down and THF was added to dilute the mixture. The THF mixture was then precipitated in water and the polymer precipitated out. The precipitate was collected and then re-precipitated in a mixture of ether/hexanes. A white powder was collected and dried under vacuum, yielding 17.6 grams of polymer (82% yield).

Example 4

Synthesis of Polyurethane MDI/THCA/Ethylene Glycol Polymer 5.75 grams (22 mmol) of 1,3,5-trishydroxyethyl cyanuric was dissolved in flask containing 50 grams of cyclohexanone under nitrogen at 100° C. for 1 hour and then cooled down to 80° C. 1.37 grams (22 mmol) of dried ethylene glycol was then added to the flask. Then, 10.0 grams (40 mmol) of methylene bis(4-phenylisocyanate) (MDI) was added in three equal portions to the flask over a time period of 60 minutes. The solution was stirred at 80° C. for an additional 60 minutes once all the MDI was added to the flask. The contents of the flask were then allowed to cool down and THF was added to the flask to dilute the mixture. The THF mixture was then precipitated in water and the polymer precipitated out. The precipitate was collected and then re-precipitated in ether. A white powder was collected and dried under vacuum, yielding 14.0 grams (82% yield).

Example 5

Preparation of Anti-Reflective Film and Results 1.5 grams of the polymer from Example 1 was dissolved in 48.5 grams of ethyl lactate to make a 3.0 wt % solution in a suitable container. 0.3 grams of Mx-270 (N,N,N,N-tetra(methoxymethyl)glycouril; Nikalac), 0.3 grams of a 10% solution of para-toulene sulfonic acid triethylamine salt in ethyl lactate, and 0.015 grams of triphenylsulfonium nonaflate were placed into the suitable container and stirred until all the components were dissolved. The mixture was then filtered through a 0.2 µm micro filter. The solution was then spun coated on a silicon wafer for 40 seconds. The coated wafer was then heated on a hot plate for 1 minute at 200° C. The film thickness was measured to be 0.11 µm. The anti-reflective coating was analyzed on a spectroscopic ellipsometer. The optimized reflective index "n" at 193 nm was 1.61 and the absorption parameter "k" was 0.21.

Example 6

Preparation of Anti-Reflective Film and Results 1.5 grams of the polymer from Example 2 was dissolved in 48.5 grams of ethyl lactate to make a 3.0 wt % solution in a suitable container. 0.3 grams of Mx-270 (N,N,N,N-tetra (methoxymethyl)glycouril; Nikalac), 0.3 grams of a 10% solution of para-toulene sulfonic acid triethylamine salt in ethyl lactate, and 0.015 grams of triphenylsulfonium nonaflate were placed into the suitable container and stirred until all the components were dissolved. The mixture was then filtered through a 0.2 µm micro filter. The solution was then spun coated on a silicon wafer for 40 seconds. The coated wafer was then heated on a hot plate for 1 minute at 200° C. The film thickness was measured to be 0.1 µm. The anti-reflective coating was analyzed on a spectroscopic ellipsometer. The optimized reflective index "n" at 193 nm was 1.67 and the absorption parameter "k" was 0.35.

Example 7

Preparation of Anti-Reflective Film and Results 1.0 grams of the polymer from Example 3 was dissolved in 48.5 grams of cyclohexanone to make a 2.0 wt % solution in a suitable container. 0.1 grams of Mx-270 (N,N,N,N-tetra (methoxymethyl)glycouril; Nikalac), 0.2 grams of a 10% solution of para-toulene sulfonic acid triethylamine salt in ethyl lactate, and 0.010 grams of triphenylsulfonium nonaflate were placed into the suitable container and stirred until all the components were dissolved. The mixture was then filtered through a 0.2 µm micro filter. The solution was then spun coated on a silicon wafer for 40 seconds. The coated wafer was then heated on a hot plate for 1 minute at 200° C. The film thickness was measured to be 0.053 µm. The anti-reflective coating was analyzed on a spectroscopic ellipsometer. The optimized reflective index "n" at 193 nm was 1.66 and the absorption parameter "k" was 0.51.

Example 8

Preparation of Anti-Reflective Film and Results 1.0 grams of the polymer from Example 4 was dissolved in 10.0 grams of cyclohexanone and 38.5 grams of propylene glycol monomethyl ether acetate to make a 2.0 wt % solution in a suitable container. 0.2 grams of Mx-270 (N,N,N,N-tetra (methoxymethyl)glycouril; Nikalac), 0.2 grams of a 10% solution of para-toulene sulfonic acid triethylamine salt in ethyl lactate, and 0.010 grams of triphenylsulfonium nonaflate were placed into the suitable container and stirred until all the components were dissolved. The mixture was then filtered through a 0.2 µm micro filter. The solution was then spun coated on a silicon wafer for 40 seconds. The coated wafer was then heated on a hot plate for 1 minute at 200° C. The film thickness was measured to be 0.056 µm. The anti-reflective coating was analyzed on a spectroscopic ellipsometer. The optimized reflective index "n" at 193 nm was 1.62 and the absorption parameter "k" was 0.53.

The invention claimed is:

1. A polymer comprising recurring monomers of
    (a) 4,4'-diphenyl-methanediisocyanate and
    (b) qlycerol, 1,3,5-tris(2-hydroxyethyl)cyanuric acid, and mixtures thereof,
    and, optionally, (c) a compound selected from
    (c1) ethylene glycol, polyethylene glycol having a molecular weight of from 200 to 1500, and mixtures thereof.

2. The polymer of claim 1 wherein the weight % of (a) in the polymer is at least 25 weight %.

3. The polymer of claim 1 wherein (c) is not present.

4. The polymer of claim 1 wherein (c) is present.

5. The polymer of claim 4 wherein the ratio of equivalents of (c):(b) is from about 1:3 to about 3:1.

6. The polymer of claim 4 wherein the ratio of equivalents of (c):(b) is from about 1:2 to about 2:1.

7. The polymer of claim 4 wherein the ratio of equivalents of (c):(b) is from about 1:1 to about 2:1.

8. An antireflective coating composition comprising:
    a) the polymer according to claim 1; and
    b) at least one crosslinking agent.

9. The composition of claim 8 which further comprises one or more components selected from cross-linking catalysts, solvents, monomeric dyes, surface leveling agents, adhesion promoters, and antifoaming agents.

10. The composition of claim 8 wherein for a) the polymer, (c) is not present in the polymer.

11. The composition of claim 8 wherein for a) the polymer, (c) is present in the polymer.

12. The composition of claim 8 wherein for a) the polymer, the ratio of equivalents of (c):(b) in the polymer is from about 1:3 to about 3:1.

13. The composition of claim 8 wherein for a) the polymer, the ratio of equivalents of (c):(b) in the polymer is from about 1:2 to about 2:1.

14. The composition of claim 8 wherein for a) the polymer, the ratio of equivalents of (c):(b) in the polymer is from about 1:1 to about 2:1.

15. A process for forming an image on a substrate comprising,
    a) coating the substrate with the composition of claim 8;
    b) heating the coating of step a);
    c) forming a coating from a photoresist solution on the coating of step b);
    d) heating the photoresist coating to substantially remove solvent from the coating;
    e) image-wise exposing the photoresist coating;
    f) developing an image using an aqueous alkaline developer;
    g) optionally, heating the substrate prior to and after development; and
    h) dry etching the composition of step b).

* * * * *